(12) United States Patent
Carl et al.

(10) Patent No.: US 10,816,626 B2
(45) Date of Patent: Oct. 27, 2020

(54) SYSTEM AND METHOD FOR MAGNETIC RESONANCE IMAGING A SUBJECT VIA A HYBRID ENCODING SCHEME

(71) Applicants: GENERAL ELECTRIC COMPANY, Schenectady, NY (US); THE REGENTS OF THE UNIVERSITY OF CALIFORNIA, Oakland, CA (US)

(72) Inventors: Michael Carl, Escondido, CA (US); Jiang Du, San Diego, CA (US); Hyungseok Jang, San Diego, CA (US)

(73) Assignees: GENERAL ELECTRIC COMPANY, Schenectady, NY (US); THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 84 days.

(21) Appl. No.: 16/163,073

(22) Filed: Oct. 17, 2018

(65) Prior Publication Data

US 2020/0124690 A1 Apr. 23, 2020

(51) Int. Cl.
*G01R 33/48* (2006.01)
*G01R 33/56* (2006.01)
*G01R 33/561* (2006.01)

(52) U.S. Cl.
CPC ..... *G01R 33/4816* (2013.01); *G01R 33/4822* (2013.01); *G01R 33/561* (2013.01); *G01R 33/5602* (2013.01)

(58) Field of Classification Search
CPC ............ G01R 33/4816; G01R 33/4822; G01R 33/5602; G01R 33/561

USPC .......................................................... 324/309
See application file for complete search history.

(56) References Cited

U.S. PATENT DOCUMENTS

| 8,120,358 | B2* | 2/2012 | Du | G01R 33/4824 |
| | | | | 324/309 |
| 8,386,013 | B2* | 2/2013 | Du | G01R 33/4824 |
| | | | | 324/307 |
| 9,018,590 | B2* | 4/2015 | Blanchon | H04N 5/3452 |
| | | | | 250/370.09 |
| 9,304,179 | B1* | 4/2016 | Xiao | G01R 33/546 |
| 9,702,953 | B1* | 7/2017 | Xiao | G01R 33/5619 |

OTHER PUBLICATIONS

Jiang Du, et al; "Ultrashort Echo Time (UTE) Magnetic Resonance Imaging of the Short T2 Components in White Matter of the Brain Using a Clinical 3T Scanner"; Elsevier, NeuroImage 87 (2017) pp. 32-41.

(Continued)

*Primary Examiner* — Reena Aurora
(74) *Attorney, Agent, or Firm* — Grogan, Tuccillo & Vanderleeden, LLP

(57) ABSTRACT

A system for magnetic resonance imaging a subject is provided. The system includes a magnet assembly and a controller. The controller is in electronic communication with the magnet assembly and operative to: perform an inversion recovery pulse on the subject via the magnet assembly; acquire an ultrashort echo from the subject via the magnet assembly using a hybrid encoding scheme; and generate an image of the subject based at least in part on the ultrashort echo.

20 Claims, 6 Drawing Sheets

(56) References Cited

OTHER PUBLICATIONS

Shu-Juan Fan, et al; "Yet More Evidence That Myelin Protons can be Directly Imaged With UTE Sequence on a Clinical 3T Scanner: Bicomponent T2 Analysis of Native and Deuterated Ovine Brain Specimens"; International Society of Magnetic Resonance in Medicine; 2017; pp. 1-10.

Shu-Juan Fan, et al.; "Inversion Recovery Ultrashort Echo Time Imaging of Ultrashort T2 Tissue Components in Ovine Brain at 3T: A Sequential D2O Exchange Study"; Wiley NMR in Biomedicine; 2017; pp. 1-10.

Jeffrey A. Fessler; "On Nufft-Based Gridding for Non-Cartesian MRI"; Journal of Magnetic Resonance 188; 2007; pp. 191-195.

David M. Grodzki, et al.; "Correcting Slice Selectivity in Hard Pulse Sequence"; Journal of Magnetic Resonance 214; 2012; pp. 61-67.

David M. Grodzki, et al.; "Ultrashort Echo Time Imaging Using Pointwise Encoding Time Reduction With Radial Acquisition (PETRA)"; Magnetic Resonance in Medicine 67; 2012; pp. 510-518.

Hyungseok Jang, et al.; "Rapid Dual-Echo Ramped Hybrid Encoding MR-Based Attenuation Correction (DRHE-MRAC) for PET/MR"; Magnetic Resonance in Medicine 79; 2018; pp. 2912-2922.

Hyungseok Jang, et al.; "Ramped Hybrid Encoding for Improved Ultrashort Echo Time Imaging"; Magnetic Resonance in Medicine 00; 2015; pp. 1-12.

Qun He, et al.; "Direct Magnitude and Phase Imaging of Myelin Using Ultrashort Echo Time (UTE) Pulse Sequences; a Feasibility Study"; HHS Public Access, Author Manuscript; Magnetic Resonance Imaging 39; Jun. 2017; pp. 194-199.

James G. Pipe, et al.; "Sampling Density Compensation in MRI: Rationale and an Iterative Numerical Solution"; Magnetic Resonance in Medicine 41; 1999; pp. 179-186.

Vipul R. Sheth, et al.; "Inversion Recovery Ultrashort Echo Time Magnetic Resonance Imaging: A Method for Simultaneous Direct Detection of Myelin and High Signal Demonstration of Iron Deposition in the Brain—a Feasibility Study"; Elsevier, Magnetic Resonance Imaging 38; 2017; pp. 87-94.

Vipul R. Sheth, et al.; "Magnetic Resonance Imaging of Myelin Using Ultrashort Echo Time (UTE) Pulse Sequences: Phantom, Specimen, Volunteer and Multiple Sclerosis Patient Studies"; Elsevier, NeuroImage 136; 2016; pp. 37-44.

Yaotang Wu, et al.; "Water- and Far-Suppressed Proton Projection MRI (WASPI) of Rat Femur Bone"; Magnetic Resonance in Medicine 57; 2007; pp. 554-567.

\* cited by examiner

SYSTEM AND METHOD FOR MAGNETIC RESONANCE IMAGING A SUBJECT VIA A HYBRID ENCODING SCHEME

TECHNICAL FIELD

This disclosure relates to a system and method for magnetic resonance imaging a subject via a hybrid encoding scheme.

DISCUSSION OF ART

Magnetic resonance imaging ("MRI") is a widely accepted and commercially available technique for obtaining digitized visual images representing the internal structure of objects having substantial populations of atomic nuclei that are susceptible to nuclear magnetic resonance ("NMR"). Many MRI systems use superconductive magnets to scan a subject/patient via imposing a strong main magnetic field on the nuclei in the subject. The nuclei are excited by a radio frequency ("RF") signal/pulse transmitted by a RF coil at characteristics NMR (Larmor) frequencies. By spatially disturbing localized magnetic fields surrounding the subject and analyzing the resulting RF responses, also referred to hereinafter as the "MR signal," from the nuclei as the excited protons relax back to their lower energy normal state, a map or image of these nuclei responses as a function of their spatial location is generated and displayed. An image of the nuclei responses, also referred to hereinafter as an "MRI image" and/or simply "image," provides a non-invasive view of a subject's internal structure.

Multiple sclerosis ("MS") is a relatively common disease wherein the myelin tissue ("myelin") of an individual's nerve cells becomes damaged. MRI has become an important tool in the diagnosis of MS as it provides for noninvasive detection and monitoring of nerve cell damage in an affected individual.

Many present approaches of MRI are unable to image myelin due to its extremely low proton density and rapid MR signal decay, which in turn often makes myelin difficult to image in white matter ("WM") and gray matter ("GM") within the brain.

While some present approaches for imaging myelin via MRI use ultrashort echo time ("UTE") inversion recovery ("IR") ("IR-UTE") in an attempt to isolate the myelin MR signal by suppressing the water MR signal in WM and GM, such approaches, often suffer from poor contrast and/or resolution across an image.

Thus, an improved system and method for magnetic resonance imaging a subject, and in particular myelin tissue, is generally desired.

BRIEF DESCRIPTION

In an embodiment, the present disclosure provides a system for magnetic resonance imaging a subject. The system includes a magnet assembly and a controller. The controller is in electronic communication with the magnet assembly and operative to: perform an inversion recovery pulse on the subject via the magnet assembly; acquire an ultrashort echo from the subject via the magnet assembly using a hybrid encoding scheme; and generate an image of the subject based at least in part on the ultrashort echo.

In another embodiment, the present disclosure provides a method for magnetic resonance imaging a subject. The method includes performing an inversion recovery pulse on the subject via a magnetic resonance imaging system, and acquiring an ultrashort echo from the subject via the magnetic resonance imaging system using a hybrid encoding scheme. The method further includes generating an image of the subject based at least in part on the ultrashort echo.

In yet another embodiment, the present disclosure provides another system for magnetic resonance imaging a subject. The system includes a magnet assembly and a controller. The controller is in electronic communication with the magnet assembly and operative to: acquire magnetic resonance data from the subject via the magnet assembly using a hybrid encoding scheme that includes single point imaging encoding interleaved with radial frequency encoding; and generate an image of the subject based at least in part on the magnetic resonance data.

DRAWINGS

Various aspects of this disclosure may be better understood upon reading the following detailed description and upon reference to the drawings in which.

Figure 1:
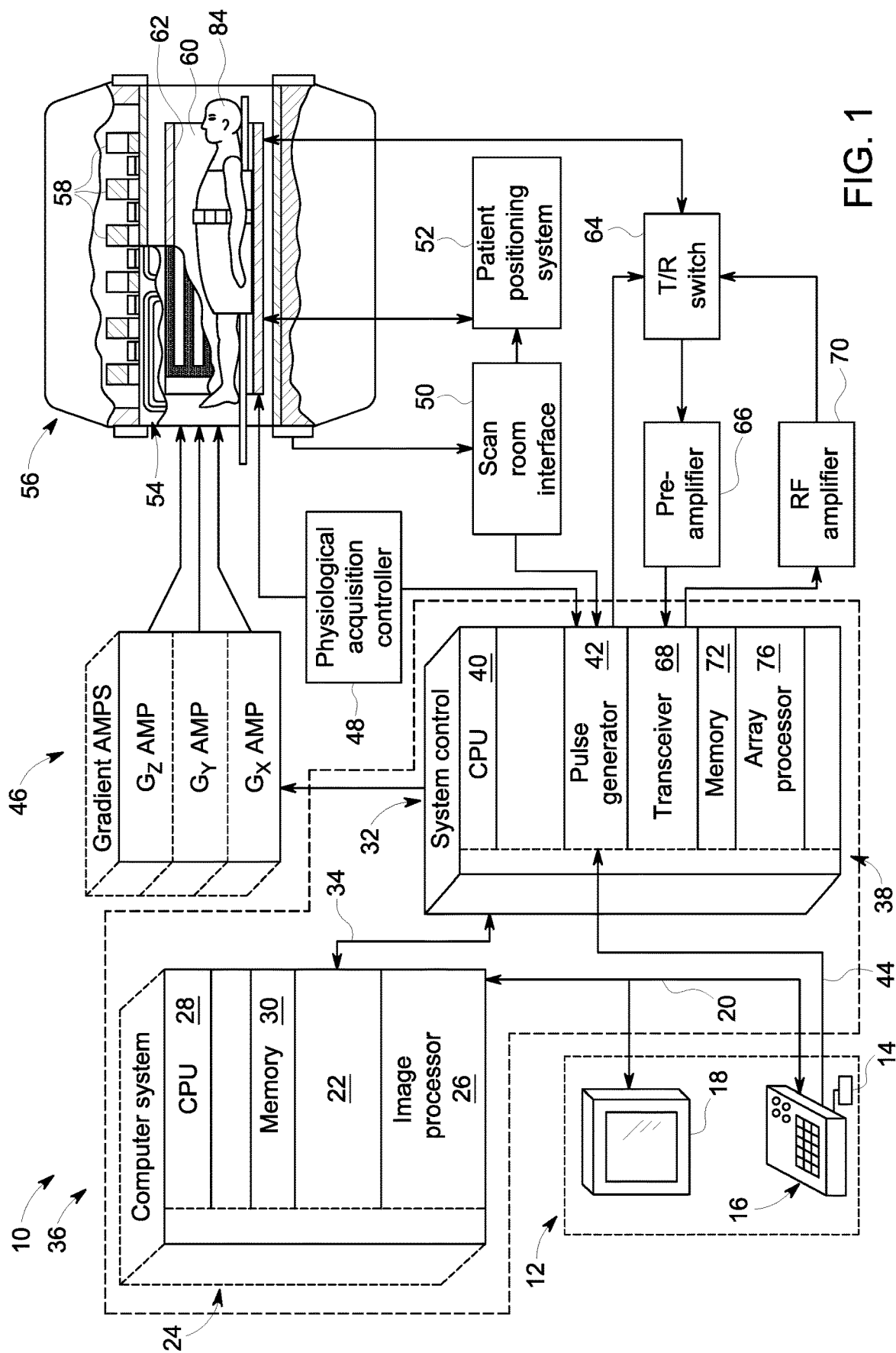
FIG. 1 is a block diagram of a system for magnetic resonance imaging a subject, in accordance with an exemplary embodiment.

The drawings illustrate specific aspects of the described systems and methods for magnetic resonance imaging a subject. Together with the following description, the drawings demonstrate and explain the principles of the structures, methods, and principles described herein. In the drawings, the size of the components may be exaggerated or otherwise modified for clarity. Well-known structures, materials, or operations may not be shown or described in detail to avoid obscuring aspects of the described components, systems, and methods.

DETAILED DESCRIPTION

One or more specific embodiments of the present disclosure are described below in order to provide a thorough understanding. These described embodiments are only examples of systems and methods for magnetic resonance imaging a subject via a hybrid encoding scheme. The skilled artisan will understand that specific details described in the embodiments can be modified when being placed into practice without deviating from the spirit of the present disclosure.

When introducing elements of various embodiments of the present disclosure, the articles "a," "an," and "the" are intended to mean that there are one or more of the elements.

The terms "first," "second," and the like, do not denote any order, quantity, or importance, but rather are used to distinguish one element from another. The terms "comprising," "including," and "having" are intended to be inclusive and mean that there may be additional elements other than the listed elements. As the terms "connected to," "coupled to," etc. are used herein, one object (e.g., a material, element, structure, member, etc.) can be connected to or coupled to another object regardless of whether the one object is directly connected or coupled to the other object or whether there are one or more intervening objects between the one object and the other object. As used herein, "electrically coupled," "electrically connected," and "electrical communication" mean that the referenced elements are directly or indirectly connected such that an electrical current may flow from one to the other. The connection may include a direct conductive connection, i.e., without an intervening capacitive, inductive or active element, an inductive connection, a capacitive connection, and/or any other suitable electrical connection. Intervening components may be present. The term "MR data," as used herein, refers to data, e.g., raw K-Space and/or image space, derived from an MR signal. The term "echo", as used herein, refers to the acquisition of MR data at a particular point in time.

In addition, it should be understood that references to "one embodiment" or "an embodiment" of the present disclosure are not intended to be interpreted as excluding the existence of additional embodiments that also incorporate the recited features. Further, the limitations of the following claims are not written in means-plus-function format are not intended to be interpreted as such, unless and until such claim limitations expressly use the phrase "means for" followed by a statement of function void of further structure.

Further, it is to be understood that embodiments of the present invention may be applicable to Positron Emission Tomography ("PET")/MRIs, and/or any other systems that include MRI systems or subsystems. Additionally, while embodiments of the present invention are disclosed herein with respect to MR imaging of myelin, it is to be understood that embodiments of the present invention are also applicable to MR imaging of any material that has a rapidly decaying MR signal.

Referring to the figures generally, the present disclosure is to provide systems and methods for magnetic resonance imaging myelin within a subject. In particular, embodiments of the present invention combine IR pulses with a hybrid encoding scheme to generate images of myelin within a subject/patient. As used herein with respect to an encoding scheme, the term "hybrid" means a scheme for encoding/reading/acquiring MR data from a subject that utilizes one or more of SPI, WASPI type/based encoding, Cartesian frequency encoding, non-Cartesian frequency encoding, e.g., radial frequency encoding, and/or other suitable encoding schemes.

As stated above, the extremely low proton density and rapid MR signal decay of myelin often makes it difficult to image in WM and GM within the brain via traditional approaches. In other words, the echo times of many traditional MRI systems are too long to sense the short-lived MR signal from myelin. While some present MRI systems have ultrashort echo times, the encoding schemes of such systems usually suffer from degraded image contrast.

Thus, as will be explained in greater detail below, embodiments of the present disclosure use an IR pulse to suppress the MR signal component from WM so that the MR signal components from both myelin and GM can be acquired via a UTE. One or more subsequent echoes may then be acquired so as to provide for subtracting out the MR signal component due to GM, thus revealing/isolating the MR signal component from myelin. Further, the hybrid encoding scheme utilized by some embodiments of the present invention ensures the optimal encoding is used at the appropriate time and/or K-Space location for a given acquisition.

By combining an IR pulse with hybrid encoding, some embodiments of the present invention provide for systems and methods of magnetic resonance imaging myelin within a subject with improved dynamic range, as compared to traditional approaches.

Accordingly, now referring to FIG. 1, the major components of an MRI system 10 incorporating an exemplary embodiment of the invention are shown. Operation of the system 10 is controlled from the operator console 12, which includes a keyboard or other input device 14, a control panel 16, and a display screen 18. The console 12 may communicate through a link 20 with a separate computer system 22 that enables an operator to control the production and display of images on the display screen 18. The computer system 22 may include a number of modules, which communicate with each other through a backplane 24. In embodiments, these include an image processor module 26, a CPU module 28, and a memory module 30, which may include a frame buffer for storing image data arrays. The computer system 22 may communicate with a separate system control or control unit 32 through a high-speed serial link 34. The input device 14 can include a mouse, joystick, keyboard, track ball, touch activated screen, light wand, voice control, or any similar or equivalent input device, and may be used for interactive geometry prescription. The computer system 22 and the MRI system control 32 collectively form an "MRI controller" 36.

In embodiments, the MRI system control 32 includes a set of modules connected together by a backplane 38. These include a CPU module 40 and a pulse generator module 42, which connects to the operator console 12 through a serial link 44. It is through link 44 that the system control 32 receives commands from the operator to indicate the scan sequence that is to be performed. The pulse generator module 42 operates the system components to execute the desired scan sequence and produces data which indicates the timing, strength and shape of the RF pulses produced, and the timing and length of the data acquisition window. The pulse generator module 42 connects to a set of gradient amplifiers 46, to indicate the timing and shape of the gradient pulses that are produced during the scan. The pulse generator module 42 can also receive patient data from a physiological acquisition controller 48 that receives signals from a number of different sensors connected to the patient, such as ECG signals from electrodes attached to the patient. And finally, the pulse generator module 42 connects to a scan room interface circuit 50, which receives signals from various sensors associated with the condition of the patient and the magnet system. It is also through the scan room interface circuit 50 that a patient positioning system 52 receives commands to move the patient to the desired position for the scan.

The pulse generator module 42 operates the gradient amplifiers 46 to achieve desired timing and shape of the gradient pulses that are produced during the scan. The gradient waveforms produced by the pulse generator module 42 are applied to the gradient amplifier system 46 having Gx, Gy, and Gz amplifiers. Each gradient amplifier excites a corresponding physical gradient coil in a gradient coil assembly, generally designated 54, to produce the magnetic field gradients used for spatially encoding acquired signals.

The gradient coil assembly 54 forms part of a magnet assembly 56, which also includes a polarizing magnet 58 (which in operation, provides a homogenous longitudinal magnetic field $B_0$ throughout a target volume 60 that is enclosed by the magnet assembly 56) and a whole-body (transmit and receive) RF coil 62 (which, in operation, provides a transverse magnetic field $B_1$ that is generally perpendicular to $B_0$ throughout the target volume 60).

The resulting signals emitted by the excited nuclei in the patient may be sensed by the same RF coil 62 and coupled through the transmit/receive switch 64 to a preamplifier 66. The amplifier MR signals are demodulated, filtered, and digitized in the receiver section of a transceiver 68. The transmit/receive switch 64 is controlled by a signal from the pulse generator module 42 to electrically connect an RF amplifier 70 to the RF coil 62 during the transmit mode and to connect the preamplifier 66 to the RF coil 62 during the receive mode. The transmit/receive switch 64 can also enable a separate RF coil (for example, a surface coil) to be used in either transmit or receive mode.

Figure 3:
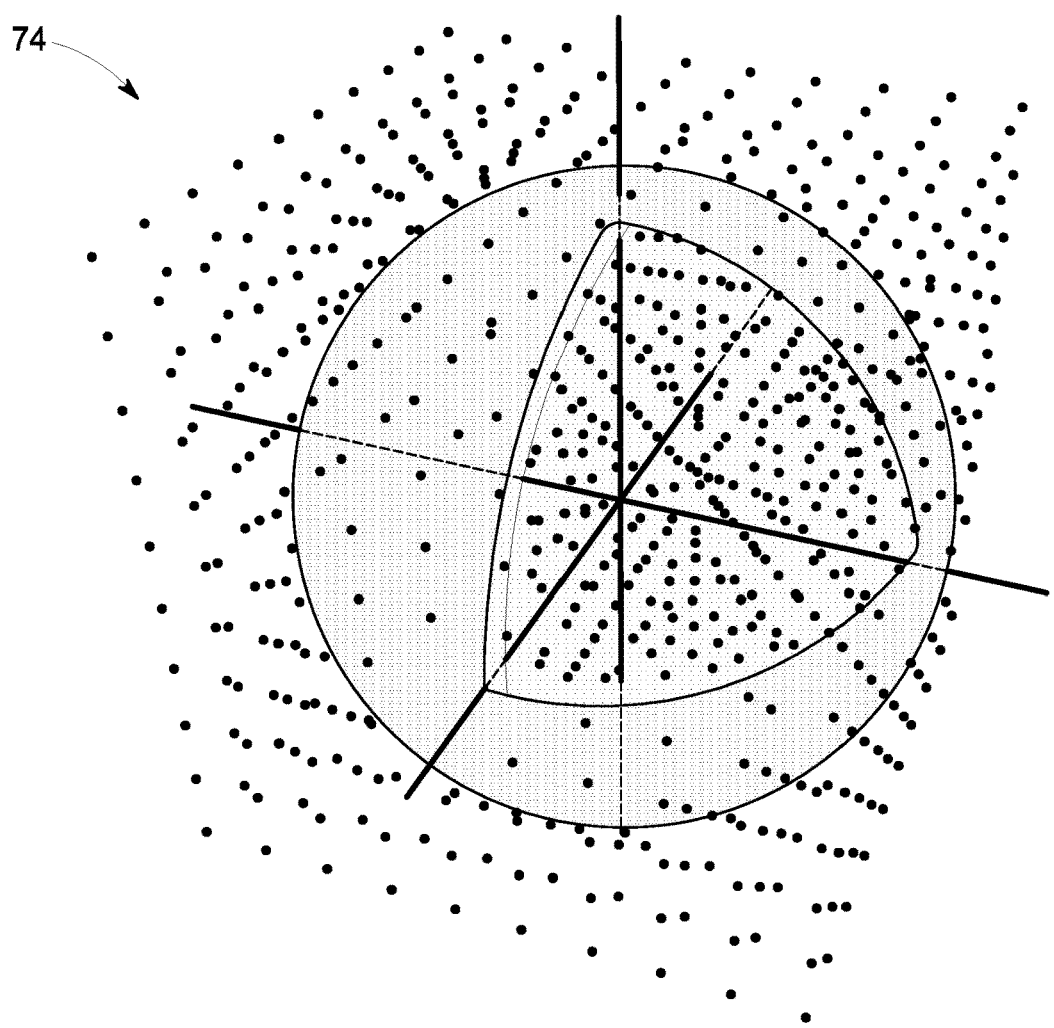
FIG. 3 is a graphical representation of a three-dimensional ("3D") K-Space of the system of FIG. 1, in accordance with an exemplary embodiment.

The MR signals picked up by the RF coil 62 are digitized by the transceiver module 68 and transferred to a memory module 72 in the system control 32. A scan is complete when an array of raw K-Space 74 (FIG. 3) data has been acquired in the memory module 72. This raw K-Space data/datum is rearranged into separate K-Space data arrays for each image to be reconstructed, and each of these is input to an array processor 76 which operates to Fourier transform the data into an array of image data. This image data is conveyed through the serial link 34 to the computer system 22 where it is stored in memory 30. In response to commands received from the operator console 12, this image data may be archived in long-term storage or it may be further processed by the image processor 26, conveyed to the operator console 12, and presented on the display 18.

Figure 2:
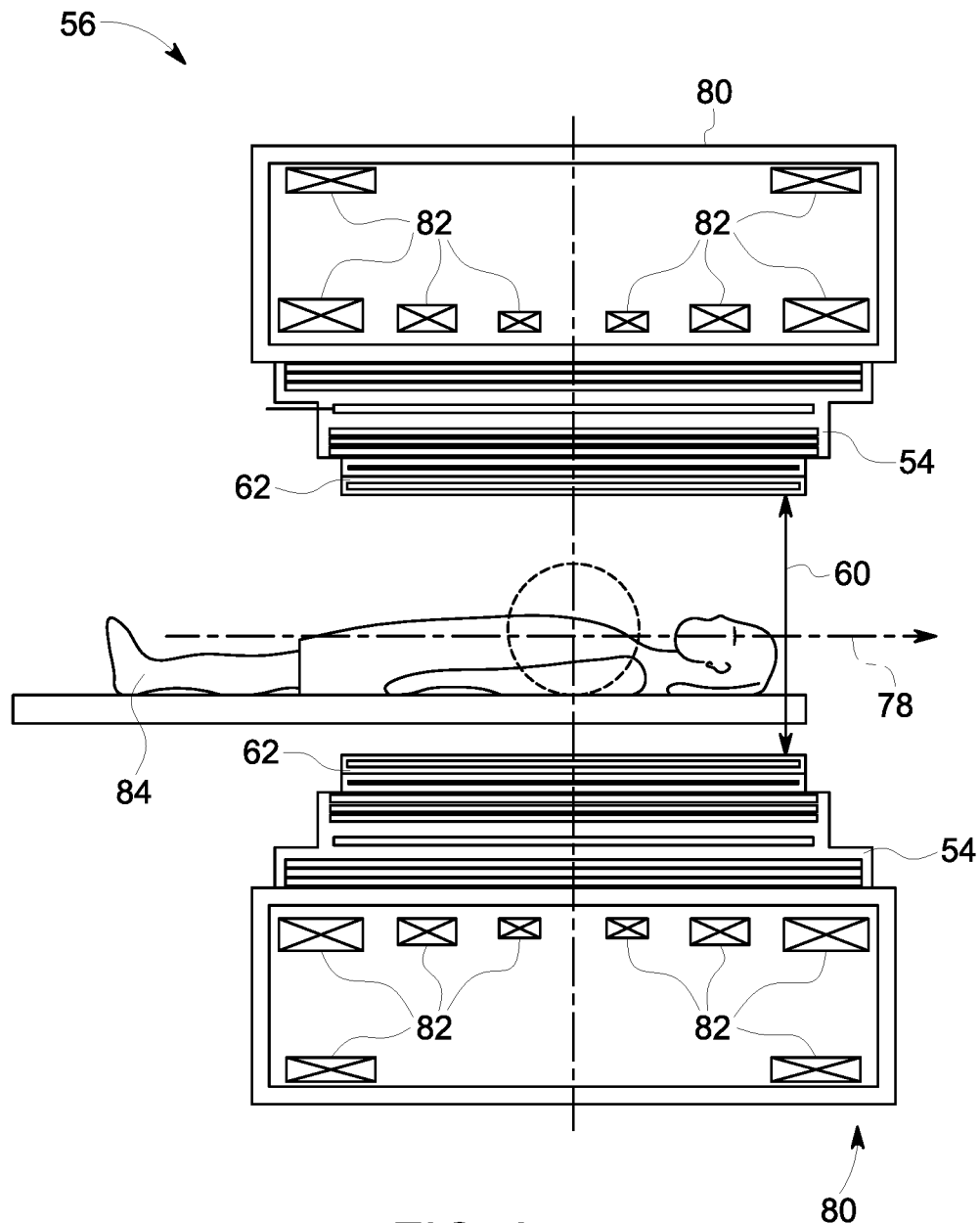
FIG. 2 is a schematic cross-sectional diagram of a magnet assembly of the system of FIG. 1, in accordance with an exemplary embodiment.

As illustrated in FIG. 2, a schematic side elevation view of the magnet assembly 56 is shown in accordance with an embodiment of the invention. The magnet assembly 56 is cylindrical in shape having a center/central axis 78. The magnet assembly 56 includes a cryostat 80 and one or more radially aligned longitudinally spaced apart superconductive coils 82 that form the polarizing magnet 58 (FIG. 1). The superconductive coils 82 are capable of carrying large electrical currents and are designed to create the $B_0$ field within the patient/target volume 60. As will be appreciated, the magnet assembly 56 may further include both a terminal shield and a vacuum vessel (not shown) surrounding the cryostat 80 in order to help insulate the cryostat 80 from heat generated by the rest of the MRI system 10 (FIG. 1). The magnet assembly 56 may still further include other elements such as covers, supports, suspension members, end caps, brackets, etc. (not shown). While the embodiment of the magnet assembly 56 shown in FIGS. 1 and 2 utilizes a cylindrical topology, it should be understood that topologies other than cylindrical may be used. For example, a flat geometry in a split-open MRI system may also utilize embodiments of the invention described below. As further shown in FIG. 2, a patient/imaged subject 84 is inserted into the magnet assembly 56.

As stated above, embodiments of the system 10 (FIG. 1) may employ UTE imaging to directly image the myelin MR signal as it has an extremely short $T2^*$, e.g., less-than-or-equal to 0.5 ms at 3T. In order to detect the myelin MR signal 86 (FIG. 4), dual echo imaging may be performed wherein the UTE image and the gradient recalled second echo image TE2 are acquired in a single acquisition (best seen in FIG. 5). Ideally, the myelin MR signal 86 from the brain of the patient 84 (FIG. 2) should be detectable by generating a short $T2^*$ image, i.e., subtracting the second echo image by the UTE image to suppress tissues with long T2. As will be understood, however, the myelin MR signal 86 is often interfered with by noise and/or aliasing/streaking artifacts from the surrounding tissues, e.g., WM and/or GM, thus significantly decreasing the sensitivity of myelin MR signal 86 detection via the RF coil 62 (FIG. 1). As will be further understood, severe discretization errors may be introduced during analog-to-digital conversion of the myelin MR signal 86 due to the dynamic range matched to the surrounding tissues. As will be appreciated, and explained below, embodiments of the present invention address the above-mentioned issues via IR preparation whereby the signals from WM are selectively suppressed.

Figure 4:
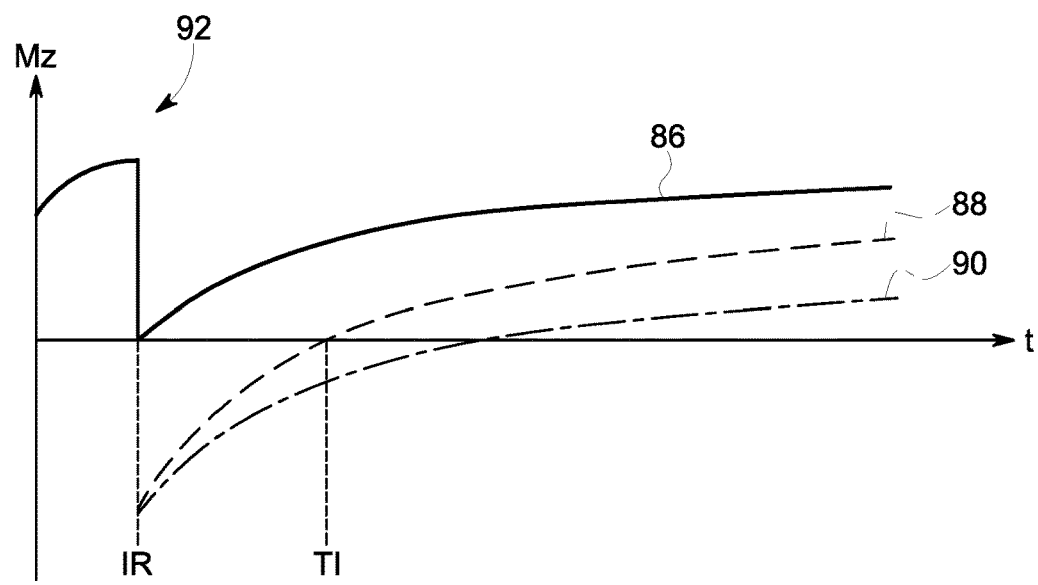
FIG. 4 is a graph depicting the MR signals of myelin, WM and GM after an IR pulse performed on the subject via the system of FIG. 1, in accordance with an exemplary embodiment.

For example, shown in FIG. 4 is a T1 recovery curve for myelin 86, WM 88 and GM 90 after an IR pulse 92, i.e., an adiabatic inversion. As can be seen, the myelin MR signal 86 is not inverted, but is instead partially saturated due to its extremely short $T2^*$ and the relatively longer duration of the inversion pulse. The GM MR signal 90 and the remaining WM MR signal 88 may be suppressed using a second echo image.

Figure 5:
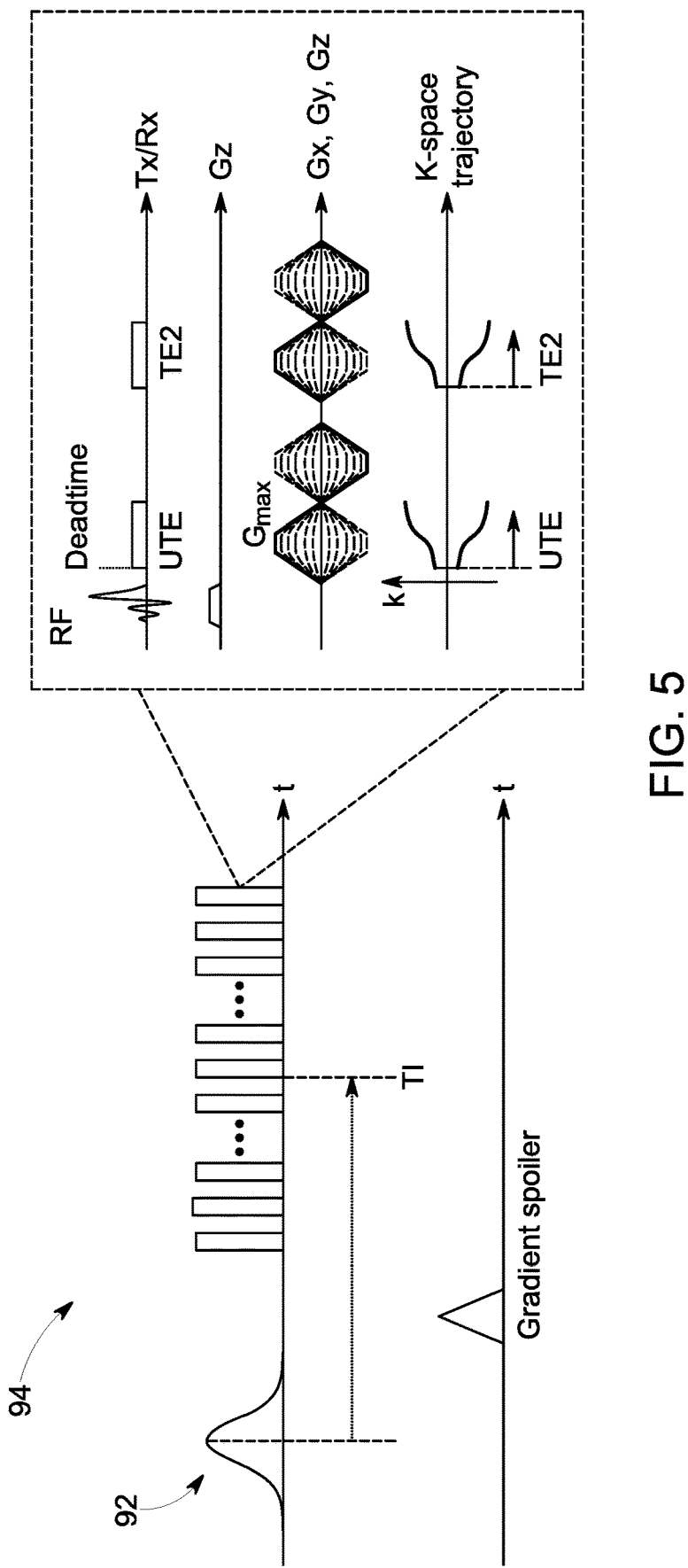
FIG. 5 is a diagram of a pulse sequence for a hybrid encoding scheme utilized by the system of FIG. 1, in accordance with an exemplary embodiment.
Figure 6:
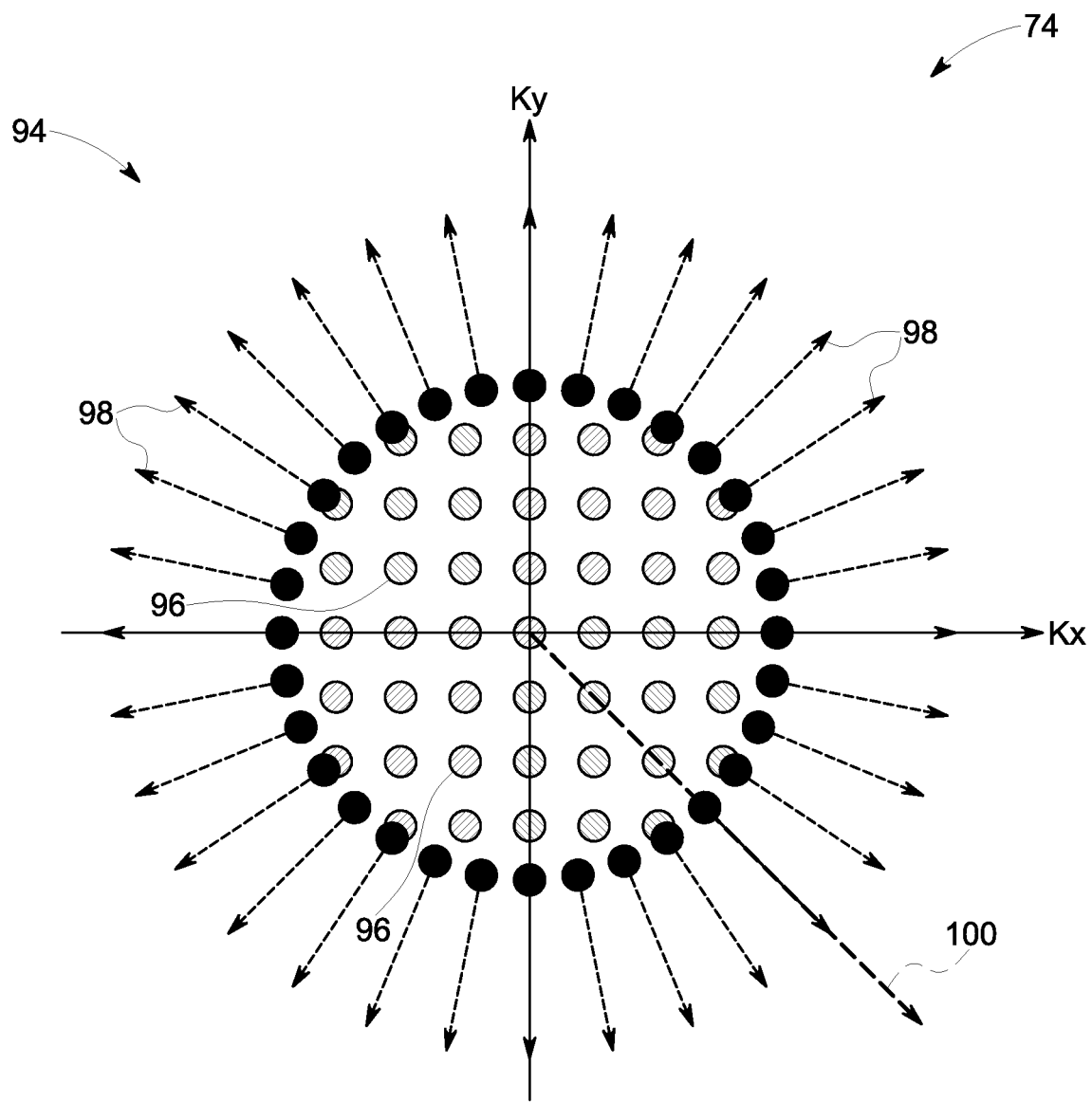
FIG. 6 is a graphical representation of the hybrid encoding scheme of FIG. 5 in a 2D projection of the 3D K-Space of FIG. 3, in accordance with an exemplary embodiment.

Turning to FIG. 5, after the IR pulse 92, a hybrid encoding scheme 94 may then be performed. As best seen in FIG. 6, in embodiments, the hybrid encoding scheme 94 may include both single point imaging encoding ("SPI") (represented by circles 96) and radial frequency encoding (represented by arrows 98). Embodiments of the invention may acquire multiple spokes 100 of K-Space 74 per IR pulse 92, centered to the desired TI, so as to reduce the total scan time. In certain aspects, the hybrid encoding scheme 94 may be performed utilizing ramp sampling to reduce encoding duration and hence improve image quality. As used herein, the term "Ramp" refers to sampling/data acquisitions performed during changing gradient amplitude. As will be appreciated, ramp sampling may allow for more time-efficient sampling. Conventional hybrid encoding techniques often only utilize constant readout gradient for simplicity, since ramp sampling is usually more technically demanding due to eddy current effects. In embodiments, however, ramped hybrid encoding may be performed with slab selection to reduce aliasing/streaking artifacts. Further, in embodiments, the IR time TI of the IR pulse 92 may be matched to a nulling point of WM, GM, and/or another tissue/material. As used herein, the term "nulling point" means the time point where longitudinal magnetization becomes zero during inversion recovery. Accordingly, in embodiments, the nulling point may be different from tissue to tissue. Thus, by performing imaging at the nulling point, some embodiments of the present invention suppress MR signal from a certain type of tissue to enhance image contrast.

As will be understood, for many conventional 3D UTE imaging schemes, it is often desirable to acquire multiple spokes after a single IR pulse in order to provide for time-efficient data acquisition. Unfortunately, in many conventional 3D UTE imaging schemes, image quality is degraded due to spokes being acquired at suboptimal TIs discrepant from a desired TI. Therefore, the time-efficiency of such traditional approaches suffers as the number of spokes per IR pulse reduces the total scan time in expense of compromised image contrast due to inclusion of many more suboptimal TIs. Further, in many conventional hybrid encoding techniques, radial frequency encoding and SPI are performed separately, e.g., SPI is not performed until all frequency encoded acquisitions have been performed. Such traditional approaches, however, are unsuitable for IR based acquisitions since central K-Space, encoded by SPI, will be contaminated by mixed in suboptimal TIs.

Figure 7:
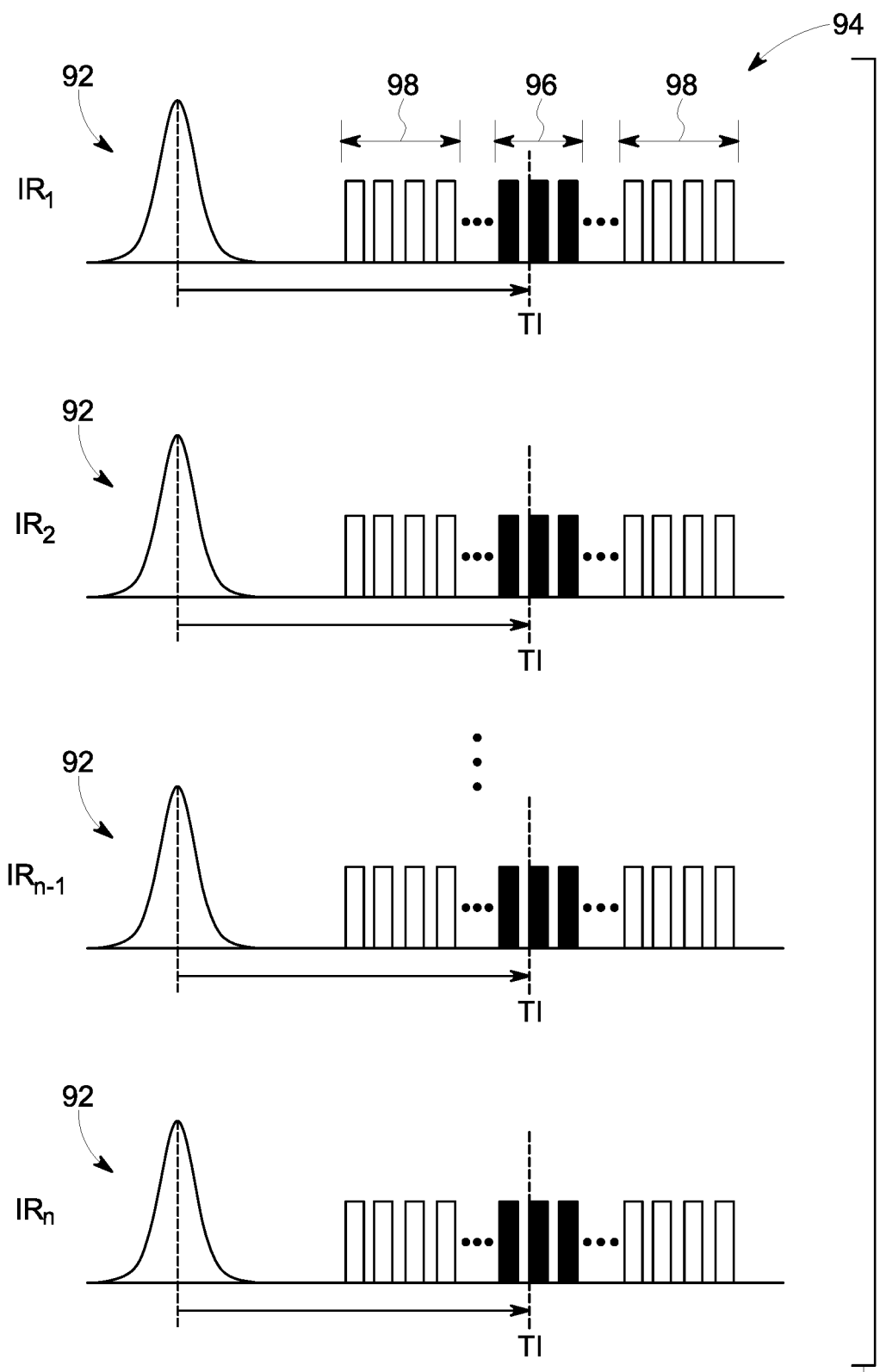
FIG. 7 is a graphical depiction of multiple IR pulses performed on the subject via the MRI system of FIG. 1, in accordance with an exemplary embodiment.

Turning to FIG. 7, contrary to traditional hybrid encoding schemes, e.g., Pointwise-Encoding Time Reduction with Radial Acquisition ("PETRA"), in which SPI is used in a passive manner to fill in missing MR data in central K-Space 74, embodiments of the present invention may avoid the aforementioned suboptimal TI issue by interleaving SPI 96 (represented by black rectangles in FIG. 7) with radial frequency encoding 98 (represented by white rectangles in FIG. 7). In other words, embodiments of the present invention alternate between using frequency encoding 98 and SPI 96 to acquire MR data after a single IR pulse 92, which in embodiments, may be repeated over multiple (n) pulses $IR_1$, $IR_2 \ldots IR_{n-1}$, $IR_n$. As shown in FIG. 7, in embodiments, the SPI 96 may occur on and/or close to an IR time TI of the IR pulse 92. Thus, in embodiments, MR data in central K-Space may be acquired with the best/most desirable TI, with the additional benefit of providing for more efficient suppression of the WM MR signal 88 for higher numbers of spokes 100, e.g., sixty (60), ninety (90) or more per IR pulse 92, as compared to traditional hybrid encoding schemes.

As will be appreciated, in embodiments, the hybrid encoding scheme disclosed herein may be generalized to optimize between scan time and image contrast for IR imaging. In such embodiments, the K-Space 74 (FIGS. 3 and 6) may be divided into sub-regions, with the best time slots having the best TIs allocated to sub-regions that most significantly contribute to image quality. While some embodiments of the present invention may have two different encoding schemes, e.g., radial frequency encoding and SPI, that correspond to two different regions of K-Space, e.g., central 96 and peripheral 98 (FIG. 6), other embodiments may divide K-Space 74 by performing segmented radial frequency encoding with different readout bandwidths, e.g., Water- and Fat-Suppressed Projection MRI ("WASPI"), which may require shorter scan times than traditional hybrid encoding schemes due to the time-efficiency of frequency encoding over SPI. Although larger SPI typically improves image quality, there are often two limitations. First, the size of the SPI region depends on the imaging gradient waveform. For example, the stronger and faster the applied gradients, the larger the SPI region will become. Second, a larger SPI region usually requires more SPI encoded points to avoid fold-over artifacts, which may, in turn, impose longer scan times.

It is also to be understood that the system 10 may include the necessary electronics, software, memory, storage, databases, firmware, logic/state machines, microprocessors, communication links, displays or other visual or audio user interfaces, printing devices, and any other input/output interfaces to perform the functions described herein and/or to achieve the results described herein. For example, as previously mentioned, the system may include at least one processor and system memory/data storage structures, which may include random access memory (RAM) and read-only memory (ROM). The at least one processor of the system 10 may include one or more conventional microprocessors and one or more supplementary co-processors such as math co-processors or the like. The data storage structures discussed herein may include an appropriate combination of magnetic, optical and/or semiconductor memory, and may include, for example, RAM, ROM, flash drive, an optical disc such as a compact disc and/or a hard disk or drive.

Additionally, a software application that adapts the controller to perform the methods disclosed herein may be read into a main memory of the at least one processor from a computer readable medium, e.g., a medium that provides or participates in providing instructions to the at least one processor of the system 10 (or any other processor of a device described herein) for execution. Such a medium may take many forms, including but not limited to, non-volatile media and volatile media.

While in embodiments, the execution of sequences of instructions in the software application causes at least one processor to perform the methods/processes described herein, hard-wired circuitry may be used in place of, or in combination with, software instructions for implementation of the methods/processes of the present invention. Therefore, embodiments of the present invention are not limited to any specific combination of hardware and/or software.

It is further to be understood that the above description is intended to be illustrative, and not restrictive. For example, the above-described embodiments (and/or aspects thereof) may be used in combination with each other. Additionally, many modifications may be made to adapt a particular situation or material to the teachings of the invention without departing from its scope.

Accordingly, by combining IR with a hybrid encoding scheme having interleaved SPI and radial frequency encoding, some embodiments of the present invention provide for systems and methods for directly imaging myelin within a human brain with improved image contrast and sensitivity of myelin MR signal detection.

Further, by providing for improved imaging of myelin, as compared to traditional approaches, some embodiments of the present invention provide for improved detection/diagnosis and/or monitoring of MS in a patient.

In addition to any previously indicated modification, numerous other variations and alternative arrangements may be devised by those skilled in the art without departing from the spirit and scope of this invention, and the appended claims are intended to cover such modifications and arrangements. Thus, while the invention has been described above with particularity and detail in connection with what is presently deemed to be the most practical and preferred aspects, it will be apparent to those of ordinary skill in the art that numerous modifications, including, but not limited to, form, function, manner of operations, and/or use may be made without departing from the principles and concepts set forth herein.

Finally, the examples and embodiments used herein are meant to be illustrative only and should not be construed to be limiting in any manner.

What is claimed is:

1. A system for magnetic resonance imaging a subject, the system comprising:
   a magnet assembly; and
   a controller in electronic communication with the magnet assembly and operative to:
   perform an inversion recovery pulse on the subject via the magnet assembly;
   acquire an ultrashort echo from the subject via the magnet assembly using a hybrid encoding scheme; and
   generate an image of the subject by combining the inversion recovery pulse with a hybrid encoding scheme based at least in part on the ultrashort echo.

2. The system of claim 1, wherein the hybrid encoding scheme includes single point imaging encoding and radial frequency encoding.

3. The system of claim 2, wherein the single point imaging encoding is interleaved with the radial frequency encoding.

4. The system of claim 2, wherein the single point imaging encoding occurs on or substantially close to an inversion recovery time of the inversion recovery pulse.

5. The system of claim 1, wherein the controller is further operative to:
acquire an additional echo from the subject via the magnet assembly after the ultrashort echo; and
the image is based at least in part on both the ultrashort echo and the additional echo.

6. The system of claim 5, wherein the image is based at least in part on subtracting the additional echo from the ultrashort echo.

7. The system of claim 1, wherein an inversion time of the inversion recovery pulse is based at least in part on a nulling point of white matter of the subject.

8. The system of claim 1, wherein the image is of myelin tissue of the subject.

9. A method for magnetic resonance imaging a subject, the method comprising:
performing an inversion recovery pulse on the subject via a magnetic resonance imaging system;
acquiring an ultrashort echo from the subject via the magnetic resonance imaging system using a hybrid encoding scheme; and
generating an image of the subject by combining the inversion recovery pulse with a hybrid encoding scheme based at least in part on the ultrashort echo.

10. The method of claim 9, wherein the hybrid encoding scheme includes single point imaging encoding and radial frequency encoding.

11. The method of claim 10, wherein the single point imaging encoding is interleaved with the radial frequency encoding.

12. The method of claim 10, wherein the single point imaging encoding occurs on or substantially close to an inversion recovery time of the inversion recovery pulse.

13. The method of claim 9, further comprising:
acquiring an additional echo from the subject via the magnetic resonance imaging system after the ultrashort echo; and
wherein the image is based at least in part on both the ultrashort echo and the additional echo.

14. The method of claim 13, wherein generating an image of the subject based at least in part on the ultrashort echo comprises:
subtracting the additional echo from the ultrashort echo.

15. The method of claim 9, wherein an inversion time of the inversion recovery pulse is based at least in part on a nulling point of white matter of the subject.

16. The method of claim 9, wherein the image is of myelin tissue of the subject.

17. A system for magnetic resonance imaging a subject, the system comprising:
a magnet assembly; and
a controller in electronic communication with the magnet assembly and operative to:
acquire magnetic resonance data from the subject via the magnet assembly using a hybrid encoding scheme that includes single point imaging encoding interleaved with radial frequency encoding; and
generate an image of the subject by combining an inversion recovery pulse with a hybrid encoding scheme based at least in part on the magnetic resonance data.

18. The system of claim 17, wherein the single point imaging encoding occurs on or substantially close to an inversion recovery time of an inversion recovery pulse.

19. The system of claim 17, wherein the hybrid encoding is ramped.

20. The system of claim 17, wherein the image is of myelin tissue of the subject.

* * * * *